United States Patent
Kunz

(10) Patent No.: US 7,706,147 B2
(45) Date of Patent: Apr. 27, 2010

(54) COMPUTER HOUSING WITH PLUG-IN CARD MODULE

(75) Inventor: Felix Kunz, Solothurn (CH)

(73) Assignee: Digital-Logic AG, Luterbach (CH)

( * ) Notice: Subject to any disclaimer, the term of this patent is extended or adjusted under 35 U.S.C. 154(b) by 46 days.

(21) Appl. No.: 12/205,244

(22) Filed: Sep. 5, 2008

(65) Prior Publication Data

US 2009/0067126 A1 Mar. 12, 2009

(30) Foreign Application Priority Data

Sep. 7, 2007 (CH) .................... 1400/07

(51) Int. Cl.
 *H05K 5/00* (2006.01)
(52) U.S. Cl. .................... 361/756; 361/679.32; 361/788
(58) Field of Classification Search ............... 361/756, 361/788, 752; 361/679.31–679.45
 See application file for complete search history.

(56) References Cited

U.S. PATENT DOCUMENTS

| | | | | |
|---|---|---|---|---|
| 5,174,762 | A | | 12/1992 | Hoppal et al. |
| 5,426,564 | A | * | 6/1995 | Hsu ............... 361/679.4 |
| 5,625,534 | A | * | 4/1997 | Okaya et al. ......... 361/679.32 |
| 5,748,443 | A | * | 5/1998 | Flint et al. ............. 361/679.32 |
| 5,978,821 | A | * | 11/1999 | Freeny ............... 361/679.33 |
| 6,078,504 | A | | 6/2000 | Miles |
| 6,198,633 | B1 | * | 3/2001 | Lehman et al. ............. 361/756 |
| 6,261,104 | B1 | | 7/2001 | Leman |
| 6,525,932 | B1 | * | 2/2003 | Ohnishi et al. ......... 361/679.41 |
| 6,605,924 | B2 | * | 8/2003 | Tanaka et al. ......... 361/679.41 |
| 2003/0123221 | A1 | | 7/2003 | Liao |
| 2005/0278569 | A1 | | 12/2005 | Srinivasan et al. |

FOREIGN PATENT DOCUMENTS

| | | |
|---|---|---|
| EP | 1067369 A1 | 1/2001 |
| WO | 02/21888 | 3/2002 |

OTHER PUBLICATIONS

C. Mulligan; "PCI Express to PCI Converters are available"; The Inquirer; Jul. 3, 2006; http://www.theinquirer.net/articles/printview/gb/inquirer/news/2006/07/03/pci-express-to-pci-converters-are-available.

* cited by examiner

*Primary Examiner*—Lisa Lea-Edmonds
(74) *Attorney, Agent, or Firm*—Rankin, Hill & Clark LLP

(57) ABSTRACT

A computer housing (41) for free-standing use includes a computer (10) with slots for the insertion of extension cards, and further at least one card carrier (20) for carrying extension cards (51). The card carrier (20) includes a carrier connector (47) whereby the card carrier (20) is connectable, by inserting the card carrier (20) in the computer housing (41), via the carrier connector (47), with a communication connector (49) of the computer (10), at least one adapter connector (48) into which an extension card (51) is pluggable, and wherein the card carrier (20) includes a communication connection between the carrier connector (47) and the at least one adapter connector (48).

16 Claims, 2 Drawing Sheets

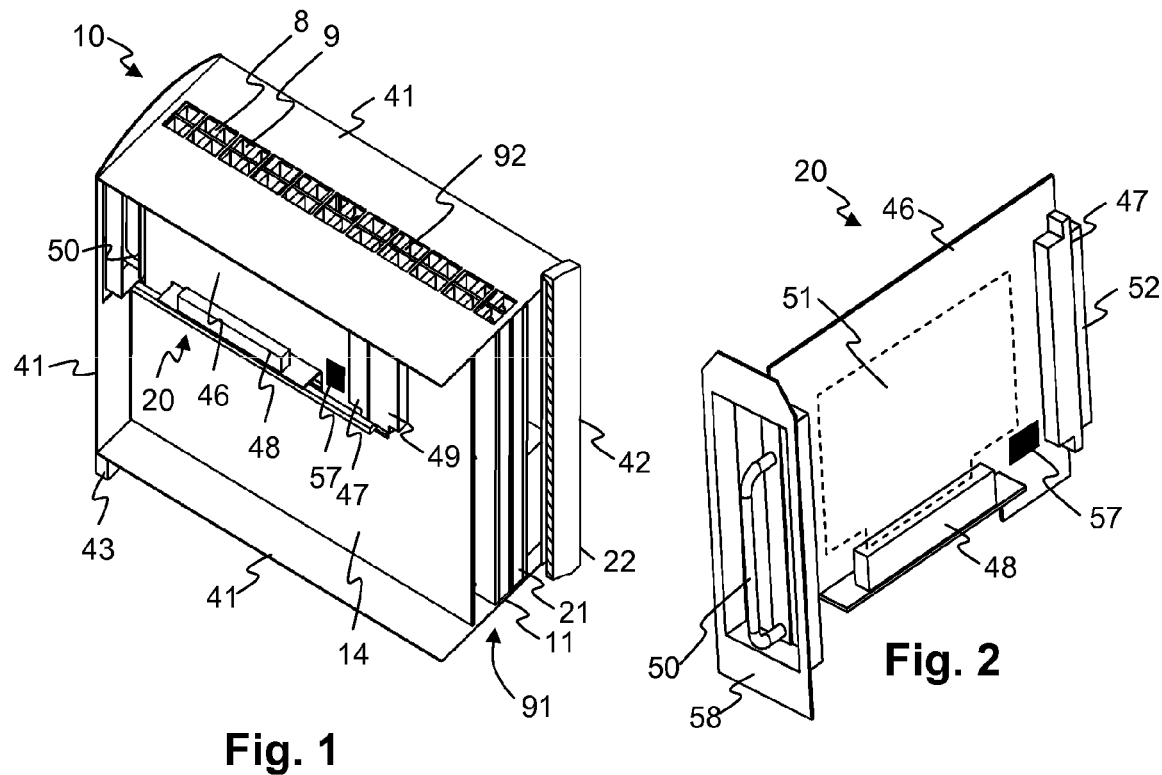
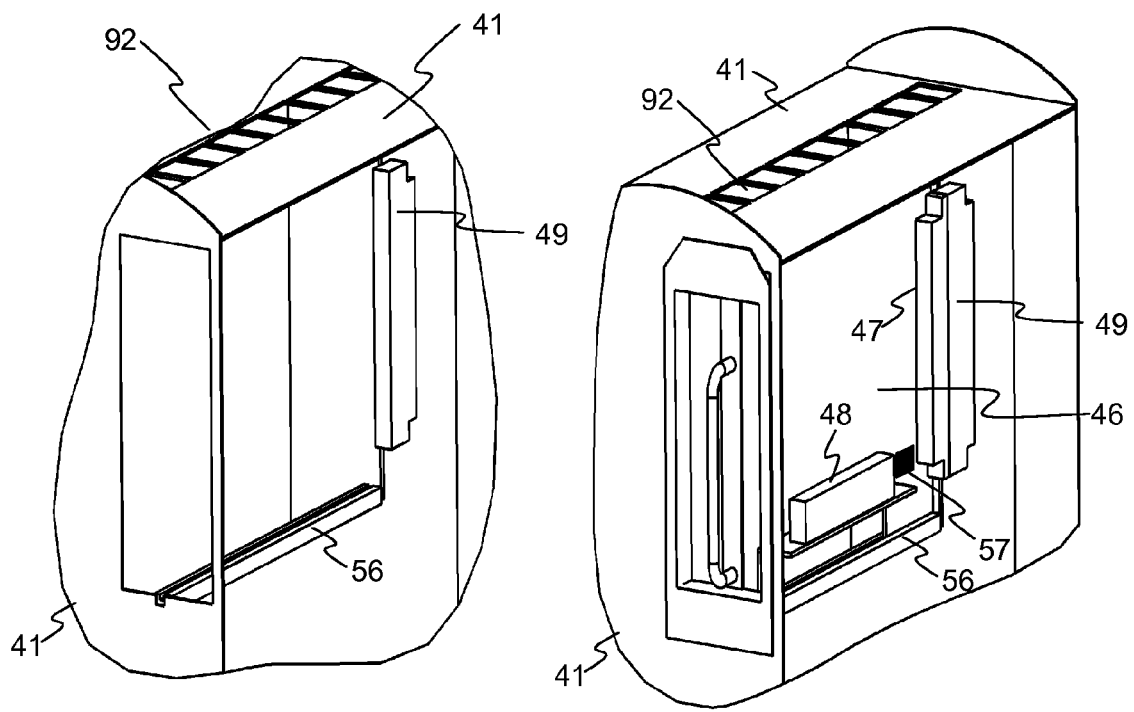
Fig. 1
Fig. 2
Fig. 3
Fig. 4

COMPUTER HOUSING WITH PLUG-IN CARD MODULE

BACKGROUND OF THE INVENTION

1. Field of the Invention

The invention relates to electrical and electronic data processing devices, in particular to a computer housing configured to accept a plug-in card module or plug-in card carrier.

2. Description of Related Art

Computer housings are generally known and often are configured to accommodate extension cards. The interfaces for extension cards are standardized, currently used standards being, for example, the PCI Standard, which is gradually being replaced by the PCI-Express Standard. Typically, extension cards are plugged in a slot of a motherboard such that they are arranged vertically to the motherboard. In order to insert or replace an extension card, the housing must be opened. For cooling the computer, in particular the main processor, but also the extension cards, fans are used.

WO 02/21888 A1 describes a plug-in card carrier into which an extension card may be plugged, with the extension card being arranged in parallel to the carrier card. The two cards can be inserted into a computer system chassis by a sliding movement and plugged into a plug of the chassis with the same movement. Light pipes function as guides for inserting the carrier into the chassis and are illuminated to show which of several carriers should be replaced.

BRIEF SUMMARY OF THE INVENTION

One object of the invention is to provide a computer housing for a freestanding computer which allows the easy insertion and removal of extension cards. A further object is to provide for a space-saving arrangement of the extension cards. A further object is to allow for an efficient cooling, in particular, a passive cooling of the computer and its components.

These objects are solved by a computer housing for freestanding use, including a computer with slots for the insertion of extension cards, wherein the computer comprises a card carrier for the insertion of extension cards, which card carrier includes:

a carrier connector whereby the card carrier is connectable, by inserting the card carrier in the computer housing, via the carrier connector with a communication connector of the computer, at least one adapter connector into which an extension card is pluggable, and wherein the card carrier comprises a communication connection between the carrier connector and the at least one adapter connector.

This makes it possible to replace an extension card by pulling the card carrier out of the housing and plugging in or removing the extension card into or from the card carrier. It is not necessary to open the housing.

In a preferred embodiment of the invention, the card carrier includes a substantially planar carrier plate defining a plane of the carrier plate, and the direction of movement when plugging in and unplugging the carrier connector is parallel to the plane of the carrier plate. Extension cards plugged into the card carrier are arranged in parallel to the plane of the carrier plate.

Adapter connectors (i.e. plugs connecting the extension cards to the card carrier) extend in parallel to the plane of carrier connectors (plugs connecting the card carrier to the motherboard). They are preferably rotated, with respect to an axis normal to this plane, by ±90° or 180°. As a result, the printed circuits or circuit boards of both the card carrier and the extension cards lie parallel to one another and form a compact unit which can be pulled out by a linear movement through a narrow slot in the housing.

Preferably, the carrier plate of the card carrier is, in the inserted position, arranged in parallel to the motherboard of the computer. Consequently, the carrier plate can also be inserted or removed in a movement parallel to the motherboard. Thus, the computer as a whole can be configured in a compact manner, in contrast to the usual arrangement, in which extension cards are arranged vertically to the motherboard.

In a further preferred embodiment of the invention, the computer is configured to be passively cooled when in operation. The computer is configured to be, when in operation, arranged in an upright position, and in this position both the carrier plate and the motherboard are arranged vertically and are passively cooled. This passive cooling is preferably achieved by an air current running vertically through, among others, gaps between the vertically arranged circuit boards of motherboard, carrier plate and extension card(s). Such an air current is generated automatically through an updraft or chimney effect in these gaps. "Passive cooling" means, in particular, that no fan is required for the cooling of the electronic components of the computer, in particular the processor(s).

In a preferred embodiment of the invention, the carrier connector, when being inserted, includes leading guiding elements for guiding the plug, before the plug during insertion moves into the communication connector of the computer. Preferably, the carrier connector further includes supply contacts for an electrical supply to the card carrier, which, when pulling out the card carrier are interrupted after the remaining contacts of the carrier connector, in particular after communication bus contacts of the carrier connector. Preferably, the carrier connector further includes signal contacts for a signaling connection of the card carrier, wherein these signal contacts, when pulling out the card carrier, are interrupted before the remaining contacts of the carrier connector. This allows to implement a Hot-Plug capability of the extension cards.

In a preferred embodiment of the invention, the card carrier includes a plurality of communication connectors, preferably with a plurality of different communication protocols. These communication connectors are connected via corresponding protocol converters or bridges to the communication interface to the motherboard and so are able to communicate with the motherboard.

A device detector is configured to determine the identity of devices that are connected to these communication connectors, and preferably also further parameters of the devices, and to transmit this information via the carrier connector to the computer's motherboard. This transmission is accomplished either via a dedicated status interface or via the same communication interface of the carrier connector by which the devices communicate with the motherboard. According to the type, identity and possibly also the parameters of the devices, a system software of the computer can be configured for communicating with the devices. This allows deployment of different types of devices with the same type of card carrier without having to adapt the card carrier. The card carrier mechanically carries one or more of the devices, and the communication interface of the device(s) is connected to (plugged into) one of the communication connectors. The system software can be adapted automatically according to the currently inserted types of devices, grace to the device detector on the card carrier.

Further preferred embodiments of the invention follow from the dependent claims.

BRIEF DESCRIPTION OF THE FIGURES

The subject matter of the invention will be explained in more detail in the following text with reference to preferred exemplary embodiments which are illustrated in the attached drawings, in which:

FIG. 1 shows a cut-open view of a computer with a card carrier according to the invention;

FIG. 2 a card carrier;

FIG. 3 a section of a computer housing with a slot for a card carrier;

FIG. 4 the slot with a card carrier inserted;

The reference symbols used in the drawings, and their meanings, are listed in summary form in the list of reference numbers. In principle, identical parts are provided with the same reference numbers in the figures.

DETAILED DESCRIPTION OF THE INVENTION

Figure 5:
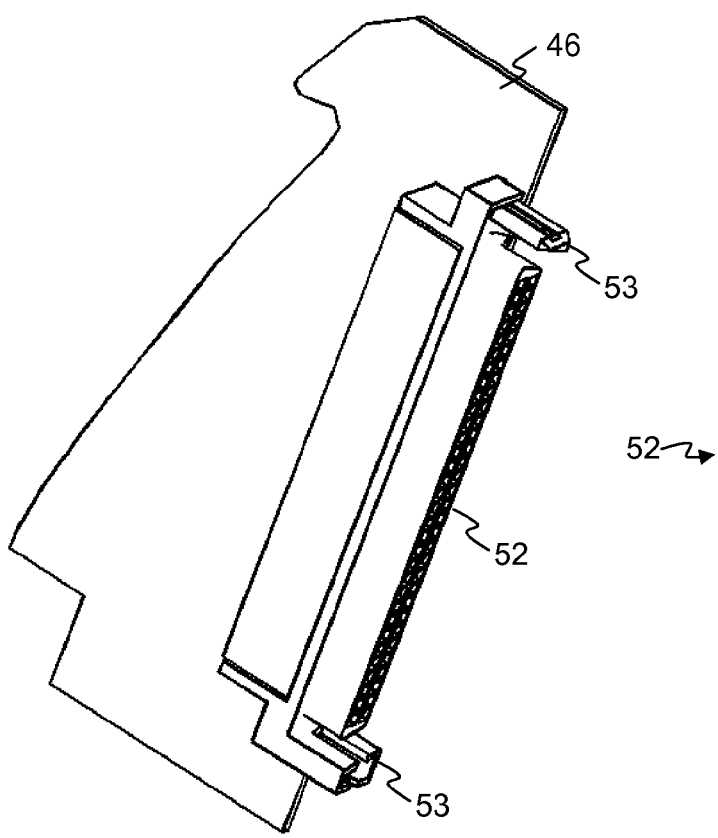
FIGS. 5 and 6 a plug for an adapter connector.

FIG. 1 shows, in a partially cut-open view, a computer 10 with a housing 41. The housing 41 is, for example, covered with a housing cladding 42 and raised by means of feet 43 over the surface on which the computer 10 is standing. The housing 41 forms the supporting frame on which the components or units of the computer 10 such as processor(s), volatile memory (RAM), mass storage devices such as hard disks, CD and/or DVD-drives, interface adapters, power supply and/or batteries etc. are mounted. These components or units are arranged at both sides of a cooling channel. The cooling channel is made up of a plurality of single air channels 9. The cooling channel runs in a vertical direction along the entire height of the housing 41 and is defined or formed by cooling bodies or cooling plates with cooling ribs 8, for example, a processor cooling body 11 and a hard disk cooling body 21. In the cooling channel, an air current is created, leading from an air intake opening 91 to an air outlet opening 92. The current absorbs heat from the cooling bodies and transports it away by convection. Consequently, the computer 10 is designed to be operated in the orientation a shown, that is, with vertically arranged cooling plates. In this normal mode of operation of the computer 10, a motherboard 14 is also arranged vertically. The motherboard 14 is arranged in parallel to the processor cooling body 11 and carries the main processor(s) and further electronic components of the computer.

A card carrier 20 is arranged with a carrier plate 46 in parallel to the motherboard 14. The card carrier 20 alone is shown in FIG. 2. It comprises on the one hand a carrier connector 47 with a plug 52, which is pluggable into a communication connector of the slot 49 of the computer 10. On the other hand, it comprises one or more adapter connectors 48, into each of which an extension card 51 is pluggable. A handle 50 serves to pull out the card carrier 20. In FIG. 2 an extension card 51 is schematically indicated, on the visible side of the carrier plate carrier plate 46, by dashed lines. Preferably, another extension card is also arranged on the opposite, not visible side of the card carrier 20, plugged into a corresponding second adapter connector. The extension card(s) 51 is/are also arranged in parallel to the carrier plate 46 and to the motherboard 14 and, thus, are also arranged in a vertical orientation. Consequently, the extension cards 51 also can be passively cooled by a vertical air current. In further preferred embodiments of the invention, more than two parallel extension cards 51 are present, and are, for example, made contact with and held by corresponding adapter connectors 48 arranged in parallel to one another.

One or more of the extension cards 51 can be addressed via the adapter connector(s) 48 by another communication bus than that of the carrier connector 47. For this, the card carrier 20, in a preferred embodiment of the invention, comprises a converter 57 or bridge which converts the different communication protocols into one another. Preferably the communication protocol of the carrier connector 47 conforms to the PCI-Express-Standard ("Peripheral Component Interconnect Express", abbreviated as: "PCIe" or "PCI-E"). This is an extension standard for connecting peripheral devices to a computer. The communication protocol of an adapter connector 48 either also corresponds to the PCI-Express Standard, such that no protocol conversion is required, and a galvanic connection can be made between the carrier connector 47 and the adapter connector 48. Alternatively, the communication protocol of an adapter connector 48 conforms to another standard, such as the older PCI-Standard, making a converter 57 necessary. In a preferred embodiment of the invention, the card carrier 20 comprises exactly one first adapter connector 48 according to the PCI-Express-Standard, and exactly one second adapter connector 48 according to the PCI-Standard. Alternatively, it comprises exactly two second adapter connectors 48 according to the PCI-Standard.

FIG. 3 shows a section of the computer housing 10 with a slot for a card carrier 20. The card carrier 20 is slidingly insertable through an opening in the housing 41 along a carrier guide 56, until the carrier connector 47 slides into a communication connector 49 and optionally engages with a snap-in connection. The configuration with the card carrier 20 inserted is shown in FIG. 4. A front plate 58 of the card carrier 20 covers the opening in the housing 41.

Figure 6:
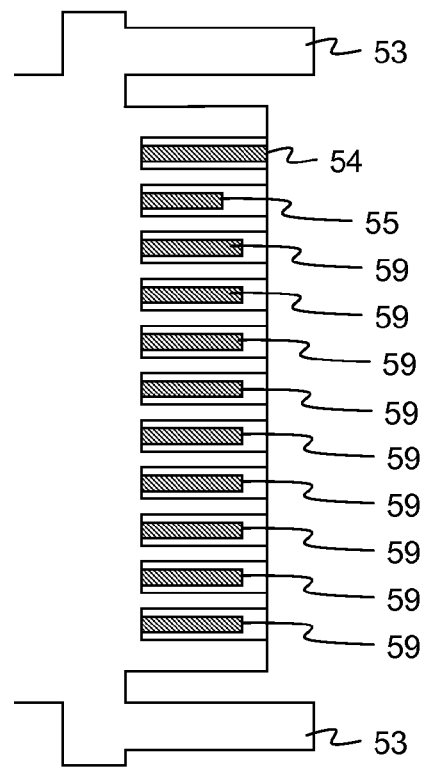

FIG. 5 shows a plug 52 of an adapter connector 47. The plug 52 comprises leading guiding elements 53, guiding pins or studs, leading supply contacts 54 and following signal contacts 55. The guiding elements 53 guide the plug 52 when sliding into the slot 49, before the electrical contacts make contact. The supply contacts 54 are leading with regard to the other electrical contacts, such that when the plug slides in, they are the first to make contact. Conversely, when pulling out the plug 52, the supply contacts 54 are the last to be interrupted, in particular after the bus contacts 59. FIG. 6 schematically shows a cross-sectional view through a plane of the plug 52 with leading and retracted contacts, assuming that the opposing contacts of the jack corresponding to the plug all have the same height. Of course, all or some of the different lengths of contacts can also be realized in the jack instead of the plug.

The signal contacts 55 (or only a single signal contact 55) follow the other contacts or bus contacts 59, such that, when inserting the plugs 52, they are the last to make contact, in particular after the bus contacts. Conversely, when unplugging, at least one of the signal contacts 55 is the first to be interrupted, which is detected by circuitry on the card carrier 20 and allows shutting down of the extension cards 51 in a controlled manner before the other signal contacts and the supply 54 is interrupted.

Figure 7:
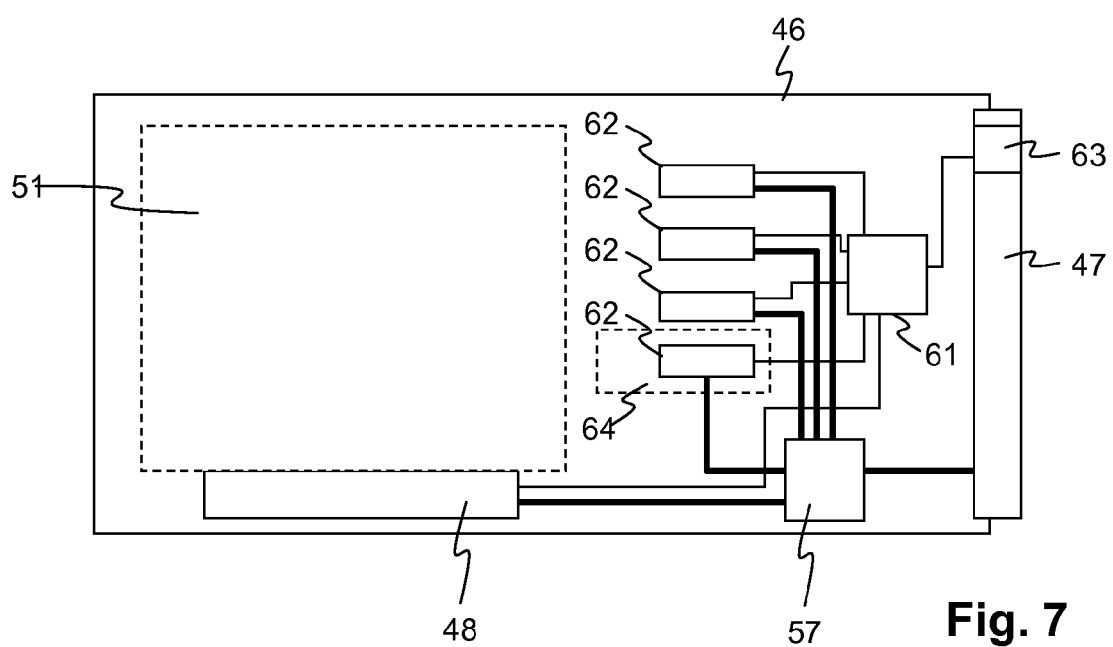
FIG. 7 a structure of a card carrier in a further embodiment.

FIG. 7 schematically shows an inner structure of a card carrier 20 in a preferred embodiment of the invention. This inner structure can be combined with the outer structure according to the other figures. The card carrier 20 with the carrier plate 46 preferably comprises, as already described, the carrier connector 47, the adapter connector 48 and a converter 57 for converting the communication protocols between these two connectors. Preferably, this is a conversion between PCI (for an extension card 51) and PCI-Express (for the carrier connector 47). The card carrier 20 preferably also comprises further communication connectors 62. These are also communicatively connected, via the converter 57 or via separate, dedicated converters (not shown), to the carrier connector 47. These converters accomplish the communication between the carrier connector 47 and corresponding communication connectors 62. The communication connectors 62 are, for example, serial interfaces according to one of the Standards RS-232, USB, USB-2, Firewire, etc. or interfaces for hard disks, such as SATA I2C, SMB etc.

The card carrier 20 preferably comprises a device detector 61, which monitors the communication connectors 62 and is configured to determine the configuration of the communication connectors 62 and information about further devices 64 connected to the communication connectors 62. For this purpose, the device detector 61 is able to communicate via the communication connectors 62 with the attached devices 64. Information on the attached devices 64 comprises in particular an identity of the device such as a unique identifier, and/or a type of device such as "GSM-Module", "WLAN-interface", "GPS-unit", "harddisk", "DVD-drive" etc, as well as parameters of the device 64. Such further devices are preferably mounted on, i.e. mechanically connected to and carried by, the card carrier 20. The device detector 61 is configured to transmit this information via a status interface 63 to a configuration unit of the computer 10. The configuration unit is preferably implemented in software and configures the system software of the computer 10, for example, by loading drivers for the connected and detected devices 64.

In the FIG. 7 the device detector 61 and the converter 57 are shown as separate units, but they can also be realized by a single hardware unit. Also, the status interface 63 can be led, as part of the electromechanical carrier connector 47, but as a dedicated physical interface separated from the PCI-Express-interfaces, to the motherboard and the remainder of the computer 10. Alternatively, the information on the devices is not transmitted over a dedicated physical status interface 63, but via the PCI-Express-interface.

LIST OF REFERENCE NUMBERS

| 8 | cooling rib | 20 | card carrier |
|---|---|---|---|
| 9 | air channel | 41 | housing |
| 10 | computer | 42 | housing cladding |
| 11 | processor cooling body | 43 | feet |
| 14 | motherboard | 46 | carrier plate |
| 21 | hard disk cooling body | 47 | carrier connector |
| 22 | hard disk | 48 | adapter connector |
| 49 | communication connector, slot | 57 | converter |
| 50 | handle | 58 | front plate |
| 51 | extension card | 59 | bus contacts |
| 52 | plug | 61 | device detector |
| 53 | guiding elements | 62 | communication connector |
| 54 | supply contacts | 63 | status interface |
| 55 | signal contacts | 64 | further device |
| 56 | carrier guide | 91 | air intake opening |
|  |  | 92 | air outlet opening |

The invention claimed is:

1. A computer housing for free-standing use, comprising a computer with slots for the insertion of extension cards, wherein the computer comprises a card carrier configured to carry extension cards of the computer, which card carrier comprises:

a carrier connector whereby the card carrier is connectable by inserting the card carrier in the computer housing, via the carrier connector, with a communication connector of the computer, at least one adapter connector into which an extension card is pluggable, and wherein the card carrier comprises a communication connection between the carrier connector and the at least one adapter connector.

2. The computer housing according to claim 1, wherein the card carrier comprises a substantially planar carrier plate defining a plane of the carrier plate, the direction of movement when plugging in and unplugging the carrier connector is parallel to the plane of the carrier plate, and inserted extension cards are arranged in parallel to the plane of the carrier plate.

3. The computer housing of claim 1, wherein the card carrier is guided by guiding elements in the computer housing and can be pushed into the housing and pulled out of the housing by a linear movement.

4. The computer housing of claim 1, wherein the carrier plate of the card carrier is arranged parallel to the motherboard of the computer and can be pushed in and pulled out in a direction parallel to the motherboard.

5. The computer housing of claim 4, wherein the computer is arranged for passive cooling when in operation, and is configured to be, when in operation, arranged in an upright position, and in this position both the carrier plate and the motherboard are arranged vertically.

6. The computer housing of claim 1, wherein the carrier connector, for being inserted, comprises leading guiding elements for guiding the plugs, before the plug, and when the card carrier is inserted, moves into the communication connector of the computer.

7. The computer housing of claim 1, wherein the carrier connector comprises supply contacts for an electrical supply to the card carrier, which, when pulling out the card carrier, are interrupted after the remaining contacts of the carrier connector.

8. The computer housing of claim 1, wherein the carrier connector comprises signal contacts for a signaling connection of the card carrier, wherein these signal contacts, when pulling out the card carrier, are interrupted before the remaining contacts of the carrier connector.

9. The computer housing of claim 1, wherein the carrier connector is a PCI-Express interface and at least one adapter connector is a PCI-Express interface.

10. The computer housing of claim 1, wherein the carrier connector is a PCI-Express interface and at least one adapter connector is a PCI interface and the card carrier comprises a converter between the PCI-Express-Bus of the carrier connector and the PCI interface of the adapter connector.

11. A card carrier for insertion in a computer housing of a computer, the card carrier being configured to carry extension cards of the computer, and the card carrier comprising:

a carrier connector whereby the card carrier is connectable, by inserting the card carrier in the computer housing, via the carrier connector, with a communication connector of the computer, at least one adapter connector into which an extension card is pluggable, and wherein the card carrier comprises a communication connection between the carrier connector and the at least one adapter connector according to claim 1.

12. The card carrier of claim 11, wherein the carrier connector is a PCI-Express interface and at least one adapter connector is a PCI interface and the card carrier comprises a converter between the PCI-Express-Bus of the carrier connector and the PCI interface of the adapter connector.

13. The card carrier of claim 11, further comprising communication connectors for communicating with further devices, wherein these further devices are attached to the card carrier, the card carrier further comprising a device detector for determining information about these further devices via the communication connectors and for transmitting this information via the carrier connector.

14. The card carrier of claim 13, wherein the information detected and transmitted by the device detector comprises information identifying the type of the further devices.

15. The card carrier of claim 11, wherein the carrier connector comprises signal contacts for a signaling connection to the card carrier, wherein these signal contacts, when pulling out the card carrier, are interrupted before the remaining contacts of the carrier connector.

16. The card carrier of claim 12, further comprising communication connectors for communicating with further devices, wherein these further devices are attached to the card carrier, the card carrier further comprising a device detector for determining information about these further devices via the communication connectors and for transmitting this information via the carrier connector.

* * * * *